(12) United States Patent
Yu et al.

(10) Patent No.: US 9,853,177 B2
(45) Date of Patent: Dec. 26, 2017

(54) PHOTOVOLTAIC DEVICE INCLUDING A BACK CONTACT AND METHOD OF MANUFACTURING

(71) Applicant: First Solar, Inc., Perrysburg, OH (US)

(72) Inventors: San Yu, Perrysburg, OH (US); Veluchamy Palaniappagounder, Toledo, OH (US); Pratima Addepalli, Saline, MI (US); Imran Khan, Perrysburg, OH (US)

(73) Assignee: First Solar, Inc., Perrysburg, OH (US)

( * ) Notice: Subject to any disclaimer, the term of this patent is extended or adjusted under 35 U.S.C. 154(b) by 0 days.

(21) Appl. No.: 14/992,304

(22) Filed: Jan. 11, 2016

(65) Prior Publication Data

US 2016/0126397 A1 May 5, 2016

Related U.S. Application Data

(63) Continuation of application No. 14/221,245, filed on Mar. 20, 2014, now Pat. No. 9,269,849.

(Continued)

(51) Int. Cl.
*H01L 31/02* (2006.01)
*H01L 31/073* (2012.01)
(Continued)

(52) U.S. Cl.
CPC ...... *H01L 31/073* (2013.01); *H01L 31/02167* (2013.01); *H01L 31/022425* (2013.01);
(Continued)

(58) Field of Classification Search
CPC .............................. H01L 31/02; H01L 31/1828
See application file for complete search history.

(56) References Cited

U.S. PATENT DOCUMENTS

| 5,393,675 A | 2/1995 | Compaan |
| 5,909,632 A | 6/1999 | Gessert |

(Continued)

FOREIGN PATENT DOCUMENTS

| WO | 2007/129097 A2 | 11/2007 |
| WO | 2012/177804 A2 | 12/2012 |

OTHER PUBLICATIONS

PCT International Search Report and Written Opinion, Application No. PCT/US2014/031290, dated Aug. 13, 2014.
(Continued)

*Primary Examiner* — Mark Prenty
(74) *Attorney, Agent, or Firm* — MacMillan, Sobanski & Todd, LLC

(57) ABSTRACT

A photovoltaic device includes a substrate, a transparent conductive oxide, an n-type window layer, a p-type absorber layer and an electron reflector layer. The electron reflector layer may include zinc telluride doped with copper telluride, zinc telluride alloyed with copper telluride, or a bilayer of multiple layers containing zinc, copper, cadmium and tellurium in various compositions. A process for manufacturing a photovoltaic device includes forming a layer over a substrate by at least one of sputtering, evaporation deposition, CVD, chemical bath deposition process, and vapor transport deposition process. The process includes forming an electron reflector layer over a p-type absorber layer.

12 Claims, 4 Drawing Sheets

Related U.S. Application Data

(60) Provisional application No. 61/804,469, filed on Mar. 22, 2013.

(51) Int. Cl.
*H01L 31/18* (2006.01)
*H01L 31/0224* (2006.01)
*H01L 31/0336* (2006.01)
*H01L 31/0216* (2014.01)

(52) U.S. Cl.
CPC .. *H01L 31/022466* (2013.01); *H01L 31/0336* (2013.01); *H01L 31/18* (2013.01); *H01L 31/1828* (2013.01); *H01L 31/1864* (2013.01); *H01L 31/1884* (2013.01); *Y02E 10/543* (2013.01); *Y02P 70/521* (2015.11)

(56) References Cited

U.S. PATENT DOCUMENTS

| | | |
|---|---|---|
| 8,084,682 B2 | 12/2011 | Chen |
| 8,187,963 B2 | 5/2012 | Basol |
| 9,269,849 B2 * | 2/2016 | Yu .................. H01L 31/022425 |
| 2008/0305573 A1 | 12/2008 | Sterzel |
| 2009/0235986 A1 | 9/2009 | Hotz et al. |
| 2012/0067392 A1 * | 3/2012 | Gloeckler ....... H01L 31/022466 |
| | | 136/244 |
| 2012/0318352 A1 * | 12/2012 | Korevaar ........ H01L 31/022425 |
| | | 136/259 |
| 2013/0098433 A1 | 4/2013 | Sankin et al. |

OTHER PUBLICATIONS

European Search Report, Application No. PCT/US2014/031290, dated Oct. 31, 2016.

* cited by examiner

PHOTOVOLTAIC DEVICE INCLUDING A BACK CONTACT AND METHOD OF MANUFACTURING

RELATED APPLICATIONS

This application is a continuation of U.S. patent application Ser. No. 14/221,245, which claims priority from U.S. provisional application Ser. No. 61/804,469, filed on Mar. 22, 2013, which is incorporated herein by reference in its entirety.

FIELD OF THE INVENTION

Disclosed embodiments relate generally to photovoltaic devices and, in particular, to photovoltaic devices having a back contact layer.

BACKGROUND OF THE INVENTION

A photovoltaic device generates electrical power by converting light into direct current electricity using semiconductor materials that exhibit the photovoltaic effect. The photovoltaic effect generates electrical power upon exposure to light as photons, packets of energy, are absorbed within the semiconductor to excite electrons to a higher energy state. These excited electrons are thus able to conduct and move freely within the material A basic unit of photovoltaic device structure, commonly called a cell, may generate only small scale electrical power. Thus, multiple cells may be electrically connected to aggregate the total power generated among the multiple cells within a larger integrated device, called a module or panel. A photovoltaic module may further comprise a protective back layer and encapsulant materials to protect the included cells from environmental factors. Multiple photovoltaic modules or panels can be assembled together to create a photovoltaic system, or array, capable of generating significant electrical power up to levels comparable to other types of utility-scale power plants. In addition to photovoltaic modules, a utility-scale array would further include mounting structures, electrical equipment including inverters, transformers, and other control systems. Considering various levels of device, from individual cell to utility-scale arrays containing a multitude of modules, all such implementations of the photovoltaic effect may contain one or more photovoltaic devices to accomplish the energy conversion.

Thin film photovoltaic devices are typically made of various layers of different materials, each serving a different function, formed on a substrate. A thin film photovoltaic device would include a front electrode and a back electrode to provide electrical access to the photoactive semiconductor layer or layers sandwiched between.

In one example of a photovoltaic device, the substrate would be a glass sheet, such as soda lime glass, float glass, or low iron glass, but could also be a polymer or other suitable material. The substrate may have various surface coatings on the internal and external surfaces, in the context of the finished device. That is, the external surface is exposed to the environment, and the internal surface is encapsulated within the photovoltaic device. The surface coating on the external surface may include an anti-reflective coating, an anti-soiling coating or other coating to improve the device performance. The substrate may include coatings on the internal surface, such as a buffer layer, transparent conductive oxide (TCO) layer and a barrier layer.

The internal coatings together comprise a TCO stack. The barrier layer lessens diffusion of sodium or other contaminants from the substrate to the semiconductor layers. The buffer layer decreases the likelihood of irregularities occurring during the formation of the semiconductor layer or layers. The TCO layer is a transparent, electrically conductive, material serving as a front electrode to the photovoltaic device to communicate a generated electrical current to a circuit, which may include an adjacent photovoltaic device, such as to adjacent cells within a photovoltaic module.

The semiconductor layer or layers will typically include a p-n junction that drives an electrical current as light is absorbed within the material. A p-n junction may be formed by of a bilayer where the first layer is an n-type layer referred to as the window layer and where the second layer is a p-type layer referred to as the absorber layer. When light is incident on the photovoltaic device, photons will excite electrons to a higher energy level causing them to conduct within the material. Front and back electrodes are connected to the semiconductor layer or layers to provide a front and back current pathways to take advantage of the conducting electrons. The efficient operation of the device, that is, how much light energy incident on the device is converted and collected as usable electrical power, may be negatively affected by losses as the generated current flows between adjacent layers of dissimilar materials. These losses may include resistance losses, and may also include loses due to recombination of mobile charge carriers.

The manufacturing of a photovoltaic structure generally includes sequentially forming the functional layers through a process that may include vapor transport deposition, atomic layer deposition, chemical bath deposition, sputtering, closed space sublimation, or any other suitable process that creates the desired material. Once a layer is formed it may be desirable to modify the physical characteristics of the layer through subsequent treatments processes. For example, a treatment process step may include passivation, which is defect repair of the crystalline grain structure, and may further include annealing. Imperfections or defects in the crystalline grain of the material disrupt the periodic structure in the layer and can create areas of high resistance or undesirable current pathways, for example, parallel to but separated from the desired current pathway such as a shunt path or short.

An activation process may accomplish passivation through the introduction of a chemical dopant to the semiconductor bi-layer as a bathing solution, spray, or vapor. Subsequently annealing the layer in the presence of the chemical dopant at an elevated temperature provides grain growth and incorporation of the dopant into the layer. The larger grain size reduces the resistivity of the layer, allowing the charge carriers to flow more efficiently. The incorporation of a chemical dopant may also make the regions of the bi-layer more n-type or more p-type and able to generate higher quantities of mobile charge carriers. Each of these improves efficiency by increasing the maximum voltage the device can produce and reducing unwanted electrically-conductive regions. In the activation process, the parameters of anneal temperature, chemical bath composition, and soak time, for a particular layer depend on that layer's material.

Therefore, it is desirable to provide an effective back electrical connection at the back of the photovoltaic device to minimize losses that may occur at the interface between the absorber layer and the back current pathway and a method of making such a photovoltaic device.

DETAILED DESCRIPTION OF EXEMPLARY EMBODIMENTS

Figure 1:
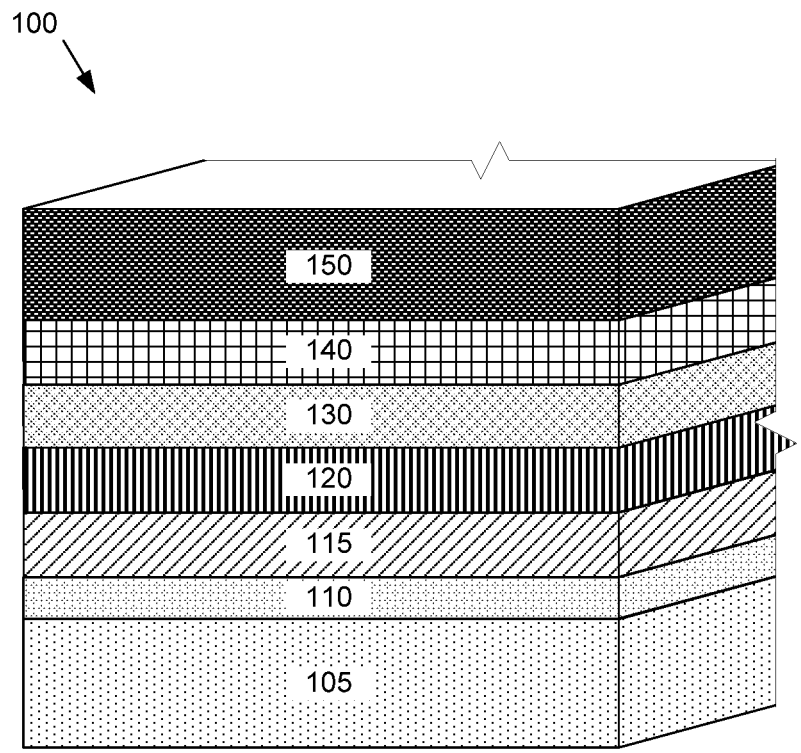
FIG. 1 depicts a schematic of functional layers in a first embodiment of a photovoltaic device.

The following detailed description and appended drawings describe and illustrate various exemplary embodiments. The description and drawings serve to enable one skilled in the art to make and use the embodiments and are not intended to impart any limitation to the scope of the embodiments. In respect of the methods disclosed, the steps presented are exemplary in nature and, thus, the order of the steps is not necessary or critical.

Each of the layers described in the following embodiments may be composed of more than one layer or film. Additionally, each layer can cover all or a portion of the device and/or all or a portion of the layer or material underlying the layer. For example, a "layer" can mean any amount of material that contacts all or a portion of a surface. During a process to form one of the layers, the created layer forms on an outer surface, typically a top surface, of a substrate or substrate structure. A substrate structure may include a base layer introduced into a deposition process and any other or additional layers that may have been deposited onto the base layer in a prior deposition process or processes. Layers may be deposited over the entirety of a substrate with certain portions of the material later removed through laser ablation, scribing, or other material-removal process.

Several specific embodiments of a novel photovoltaic device will be described with reference to the figures. A novel photovoltaic device according to the disclosed embodiments can include electron reflector layers providing an ohmic contact to achieve high performance efficiency at the interface between the absorber layer and the back current pathway. In a first embodiment, an electron reflector layer including zinc telluride (ZnTe) doped with copper telluride ($Cu_2Te$) is disclosed. In a second embodiment, an electron reflector layer including a $ZnTe/Cu_2Te$ alloy is disclosed. In a third embodiment, an electron reflector layer is disclosed including a bi-layer of materials having different compositions, with a first layer including ZnTe or cadmium zinc telluride (CZT) and a second layer including $Cu_2Te$ in multiple particular combinations.

To improve the flow of electrical current in a photovoltaic device, a technique called electron reflection may be used. An electron reflector reduces charge loss between the absorber layer and the back current pathway by reducing the recombination of electron-hole pairs at the surface of the absorber layer closest to the back current pathway. Electron reflection is practically applied, for example, by the addition of an electron reflector material layer between the absorber layer and the back current pathway. The electron reflector layer is capable of providing a conduction-band energy barrier at the junction between the absorber layer and the metal back conductor.

By way of example, an electron reflector material layer between a cadmium telluride (CdTe) absorber layer and a back current pathway is preferably formed from a material which has a higher band gap than cadmium telluride (CdTe) wherein the band gap is the energy required to excite valence electrons to the conduction band of the material where electron movement as electrical current can occur. The electron reflector layer thus provides a conduction-band energy barrier which requires higher energies for electron movement, reducing the number of electrons having the tendency and energy to migrate to the surface of the absorber layer and into or across the electron reflector layer.

The performance of the photovoltaic device can be further improved where the electron reflector layer also provides a low-resistance ohmic contact at the interface between the electron reflector layer and the absorber layer. Low resistance ohmic contacts can limit the power dissipation via heat generation.

A photovoltaic device 100 according to the present disclosure is depicted in FIG. 1. Making up the photovoltaic device 100, an n-type window layer 115 comprising, for example, cadmium sulfide (CdS), is deposited over a substrate structure including a base layer 105 and a TCO layer 110. A p-type absorber layer 120 comprising, for example, cadmium telluride (CdTe), is deposited over the window layer 115. The window layer 115 and the absorber layer 120 form a p-n junction. An electron reflector layer 130 is deposited over the absorber layer. A back electrode layer 140 and a back contact layer 150 are formed over the electron reflector layer 130. Together, the back electrode layer 140 and the back contact layer comprise the back current pathway for the photovoltaic device as depicted.

The base layer 105 may include glass, for example, soda lime glass, float glass or low-iron glass. Alternatively, the base layer 105 may include polymeric, ceramic, or other materials that provide a suitable structure for forming a base of photovoltaic cell. Preferably, the base layer 105 transmits light through its thickness with minimal or no absorption or reflection of photons. The base layer 105 provides a substrate surface upon which further layers of material are sequentially formed to create the photovoltaic device. The base layer 105 may have additional layers applied (not shown) that improve the transmission of photons through its thickness, which may include anti-reflective coatings or anti-soiling coatings.

The base layer 105 optionally may have additional layers applied (not shown) that promote the chemical stability of the glass, which may include a barrier layer that inhibits the diffusion of chemical ions from, into, or across the glass substrate. The barrier layer may be formed of, for example, silicon nitride, silicon oxide, aluminum-doped silicon oxide, boron-doped silicon nitride, phosphorus-doped silicon nitride, silicon oxide-nitride, or combinations or alloys thereof. The barrier layer can be formed over the base layer 105 through various deposition methods including chemical vapor deposition, molecular beam deposition, sputtering, spray pyrolysis, and other conventional methods.

The TCO layer 110 allows light to pass through to a semiconductor window layer 115 while serving as an ohmic electrode to transport photogenerated current away from the light-absorbing p-n junction as the front current pathway. The TCO layer 110 may include, for example, tin oxide, zinc oxide, indium gallium oxide, cadmium stannate, cadmium tin oxide, cadmium indium oxide, fluorine doped tin oxide, aluminum doped zinc oxide, or indium tin oxide, combinations and doped variations thereof, or any other suitable material. The TCO layer 110 can be formed over the base layer 105, or a barrier layer (if included), through various deposition methods including chemical vapor deposition, molecular beam deposition, sputtering, spray pyrolysis, and other conventional methods.

The TCO layer 110 optionally may further include additional material layers applied over its surface (not shown), as a buffer layer that promotes the electrical function of the TCO or that provides an improved surface for the subsequent deposition of semiconductor materials. The buffer layer may be formed of, for example, tin oxide, zinc tin oxide, zinc oxide, zinc oxysulfide, or zinc magnesium oxide. The buffer layer can be formed over the TCO layer 110, through various deposition methods including chemical vapor deposition, molecular beam deposition, sputtering, spray pyrolysis, and other conventional methods.

The window layer 115 may include an n-type semiconductor and forms the n-type region of the p-n junction within the photovoltaic device 100. The window layer 115 preferably allows sunlight to pass through its thickness and may be formed of a cadmium sulfide (CdS) material that further includes impurities or dopants in the CdS bulk material. The window layer 115 may be between 10 nm to 100 nm thick or alternatively between 30 nm to 75 nm thick. The window layer 115 may be formed over the TCO layer 110, or a buffer layer disposed thereon, by a deposition process, such as vapor transport deposition, atomic layer deposition, chemical bath deposition, sputtering, closed space sublimation, or any other suitable process.

The p-type absorber layer 120 may include a p-type semiconductor material to form the p-type region of the p-n junction within the photovoltaic device 100. The absorber layer 120 preferably absorbs photons passing through from the window layer 115 to mobilize charge carriers. The absorber layer 120 may be formed of CdTe, Cadmium sulphotelluride ($Cd_{(1-x)}S_xTe$, $0<x<1$), or include other materials or alloys. An absorber layer 220 formed of CdTe may further include impurities or dopants in the CdTe bulk material. The absorber layer 120 may be between 500 nm to 8000 nm thick, or alternatively between 1000 nm to 3500 nm thick. The absorber layer 120 may be formed over the window layer 115 by a deposition process, such as vapor transport deposition, atomic layer deposition, chemical bath deposition, sputtering, closed space sublimation, or any other suitable process.

The back contact layer 150 and back electrode layer 140 are provided opposite to the TCO layer 110, sandwiching the semiconductor layers of the photovoltaic device 200. The back contact layer 150 and back electrode layer 140 serves as a second ohmic electrode to transport photogenerated electrical current through the back current pathway. The back electrode layer 140 can include electrically conductive materials, such as molybdenum nitride ($MoN_x$), chromium nitride ($CrN_x$), silver, nickel, copper, aluminum, titanium, palladium, chrome, molybdenum, gold, or combinations thereof. The back contact layer 150 and can include electrically conductive materials, such as tin, silver, nickel, copper, aluminum, titanium, palladium, chrome, molybdenum, gold, or combinations thereof. The back contact layer 150 and back electrode layer 140 can be formed through various deposition methods including chemical vapor deposition, molecular beam deposition, sputtering, spray pyrolysis, and other conventional methods. Alternative configurations where the back electrode layer 140 and the back contact layer 150 are in reverse position with respect each other are also possible (not shown).

The TCO layer 110 may form or may be electrically connected to a front current pathway through which the electrical current generated by the active layers of the photovoltaic device may flow. The back contact layer 150 and back electrode layer 140 may form or may be electrically connected to a back current pathway through which the electrical current generated by the active layers of the photovoltaic device may flow. The front current pathway may connect one photovoltaic cell to an adjacent cell in one direction within a photovoltaic module or, alternatively, to a terminal of the photovoltaic module. Likewise, the back current pathway may connect the photovoltaic cell to a terminal of the photovoltaic module or, alternatively, to an adjacent cell in a second direction within the photovoltaic module, forming a series configuration among adjacent cells. The front or back current pathways may connect the photovoltaic cell to an external terminal of the photovoltaic module in which it is located.

According to the first embodiment shown in FIG. 1, an electron reflector layer 130 is provided between the absorber layer 120 and the back electrode layer 140. In this embodiment, the electron reflector layer 130 is a zinc telluride (ZnTe) layer doped with copper telluride ($Cu_2Te$).

Doping is a process of intentionally introducing impurities into an otherwise extremely pure material, such as a semiconductor material, in order to modulate its electrical or optical properties. In this embodiment, the electron reflector layer 130 contains primarily ZnTe with a $Cu_2Te$ dopant present in concentrations up to 5 at %. The compositional ratio (at %) of a compound, for example $ZnTe:Cu_2Te$ is determined by comparing the number of $Cu_2Te$ atoms in a given amount of the material with the total sum of ZnTe atoms and $Cu_2Te$ atoms in the same given amount. For example, where x=5 at %, there are 19 ZnTe atom for every 1 $Cu_2Te$ atom in a given amount of $ZnTe:(Cu_2Te)_{5\%}$ material. The electron reflector layer 130 may be between about 5 nm to about 25 nm thick, or alternatively between about 15 nm to about 20 nm thick.

As an alternative configuration of the first embodiment, the electron reflector layer 130 may be deposited having a dopant gradient through the thickness of the layer. In such case the presence of the $Cu_2Te$ dopant may vary so that there is less $Cu_2Te$ present, for example about 0.01 at %, where the electron reflector layer 130 is in contact with the absorber layer 120 and more $Cu_2Te$ present, for example about 5 at %, where the electron reflector layer 130 is in contact with the back electrode layer 140 or the back contact layer 150. This gradient may be stepwise, where discrete adjacent layers of the material have different amounts of dopant; or may be continuous so that the amount of dopant gradually changes through the thickness of the layer.

An electron reflector layer 130 according to the first embodiment may be formed through a variety of known deposition processes including, for example, sputtering, physical vapor deposition, chemical vapor deposition, electro-chemical deposition, atomic layer deposition, thermal or electron-beam evaporation, and pulse laser deposition. One exemplary process for creating an electron reflector layer 130 would include the steps of: first, providing a substrate structure including a base layer, such as glass, with a TCO, window layer and absorber layer formed thereon within a deposition chamber. Second, evaporating a mixture of ZnTe and $Cu_2Te$ powders within the deposition chamber and directing the vapor across the substrate structure using an inert carrier gas, such as a noble gas or nitrogen. Within the deposition chamber the substrate structure is at a temperature below the condensation threshold of the material as the vapor is directed across the substrate structure to facilitate the formation of the layer.

An alternative exemplary process for creating the electron reflector layer 130 may include a sputtering process, rather than an evaporation process. Sputtering is a process whereby atoms are ejected from a solid target material due to bombardment of the target by energetic particles, such as from an ion or plasma source. In the exemplary process, the sputtering target may be made of the mixture of ZnTe and $Cu_2Te$. The material sputtered off the target is deposited onto the substrate in an inert gas ambient, such a noble gas, an argon gas, or other gas ambient including argon, hydrogen, nitrogen or combinations thereof. The sputtering deposition may be processed in a reduced vacuum, between about 0.01 mTorr to about 50 mTorr. The sputtering deposition may be processed at room temperature or at an elevated temperature between about room temperature up to about 400° C.

The ratio of ZnTe to $Cu_2Te$ powder in sputtering target or the evaporation source may about match the composition of the deposited layer. For example, the sputtering target or evaporation source may contain about 5% $Cu_2Te$ powder with about 95% ZnTe powder to deposit a material layer of ZnTe doped to about 5% $Cu_2Te$. Alternatively, the composition of the powder mix in the sputtering target or evaporation source may require a different composition to achieve the composition of the deposited layer. For example, the sputtering target or evaporation source may contain a powder mix of about 7%, or up to about 10% $Cu_2Te$ with about 93% or about 90% ZnTe in order to achieve a deposited layer of $ZnTe:(Cu_2Te)_{5\%}$.

In order to form a gradient dopant concentration it may be necessary to evaporate the materials in multiple evaporation sources and mix them in vapor form during the deposition process or by sputtering the materials from targets having various compositions that could be co-sputtered at the same time with a controlled deposition rate ratio to achieve the desired gradient of the layer. Alternatively, the evaporation or sputtering process may be performed in sequential steps using multiple evaporations sources or multiple targets of various compositions.

Figure 2:
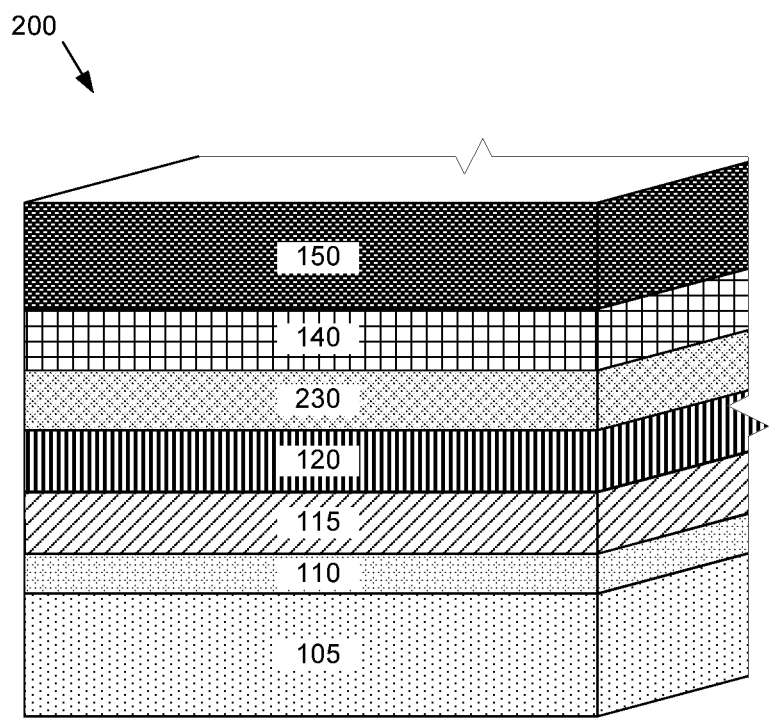
FIG. 2 depicts a schematic of functional layers in a second embodiment of a photovoltaic device.

Referring now to FIG. 2, a second embodiment is shown where like layers are designated as in the prior embodiment and described above. A photovoltaic device 200 according to the present embodiment includes a window layer 115 deposited over a substrate structure including a base layer 105 and a TCO layer 110. An absorber layer 120 is deposited over the window layer 115. The window layer 115 and the absorber layer 120 form a p-n junction in the photovoltaic device 200. An electron reflector layer 230 is deposited over the absorber layer 120. A back electrode layer 140 and a back contact layer 150 are formed over the electron reflector layer 230.

The electron reflector layer 230 according to the present embodiment is provided between the absorber layer 120 and the back electrode layer 140. In this embodiment, the electron reflector layer 230 is a $ZnTe/Cu_2Te$ alloy. The electron reflector layer 230 may be between about 5 nm to about 25 nm thick or alternatively between about 15 nm to about 20 nm thick.

Unlike the present embodiment, the doped $ZnTe:Cu_2Te$ material of the prior embodiment maintains the crystal structure of a pure ZnTe material with the $Cu_2Te$ present as impurities within the ZnTe crystal structure. According to the present embodiment, the electron reflector layer 230 is a ternary alloy of zinc, copper and tellurium having a formulation of $(Cu_2)_xZn_{(1-x)}Te$, where x is between at least 5 at % and about 60 at %. The ternary alloy forms a crystal structure of $(Cu_2)_xZn_{(1-x)}Te$, with the presence of copper influencing the morphology, or form, of crystal structure within the material, unlike in the first embodiment above.

As an alternative configuration of the second embodiment, the electron reflector layer 230 may be deposited having an alloy composition gradient through the thickness of the layer. In such case the proportion of $Cu_2Te$ in the alloy may vary so that there is less $Cu_2Te$ present, for example about 5 at %, where the electron reflector layer 230 is in contact with the absorber layer 120 and more $Cu_2Te$ present, for example about 25 at %, where the electron reflector layer 230 is in contact with the back electrode layer 140 or the back contact layer 150. This gradient may be stepwise, where discrete adjacent layers of the material have different proportions of alloy components; or may be continuous so that the alloy proportion gradually changes through the thickness of the layer.

An electron reflector layer 230 according to the second embodiment may be formed through a variety of known deposition processes including, for example, sputtering, physical vapor deposition, chemical vapor deposition, electro-chemical deposition, atomic layer deposition, thermal or electron-beam evaporation, and pulse laser deposition. One exemplary process for creating the electron reflector layer 230 would include the steps of: first, providing a substrate structure including a base layer, such as glass, with a TCO, window layer and absorber layer formed thereon within a deposition chamber. Second, evaporating a powder of ZnTe/$Cu_2Te$ alloy within the deposition chamber and directing the vapor across the substrate structure using an inert carrier gas, such as a noble gas or nitrogen. Within the deposition chamber the substrate structure is at a temperature below the condensation threshold of the material as the vapor is directed across the substrate structure to facilitate the formation of the layer.

An alternative exemplary process for creating the electron reflector layer 230 may include a sputtering process, rather than an evaporation process. In the exemplary process, the sputtering target may be made of an alloy of ZnTe and $Cu_2Te$. The material sputtered off the target is deposited onto the substrate in an inert gas ambient, such a noble gas, an argon gas, or other gas ambient including argon, hydrogen, nitrogen or combinations thereof. The sputtering deposition may be processed in a reduced vacuum, between about 0.01 mTorr to about 50 mTorr. The sputtering deposition may be processed at room temperature or at an elevated temperature between about room temperature up to about 400° C.

The composition of the ZnTe/$Cu_2Te$ alloy in the powder or the sputter target can match the composition of the deposited layer. For example, the sputtering target or evaporation source may contain a powder of $(Cu_2)_xZn_{(1-x)}Te$ where x is about equal to, for example, 15% to deposit a material layer of $(Cu_2)_xZn_{(1-x)}Te$ where x is equal to about 15%. Alternatively, the composition of the powder alloy in the evaporation source may require a different composition to achieve the target composition of the deposited layer. For example, the evaporation source may contain a powder mix of about 20%, or up to about 25% $Cu_2Te$ with about 80% or about 75% ZnTe in order to achieve a deposited layer of $(Cu_2)_xZn_{(1-x)}Te$ where x is equal to about 15%.

In order to form a gradient dopant concentration it may be necessary to evaporate the materials in multiple evaporation sources and mix them in vapor form during the deposition process or by sputtering the materials from targets having various compositions that could be co-sputtered at the same time with a controlled deposition rate ratio to achieve the desired gradient of the layer. Alternatively, the evaporation or sputtering process may be performed in sequential steps using multiple evaporations sources or multiple targets of various compositions.

Figure 3:
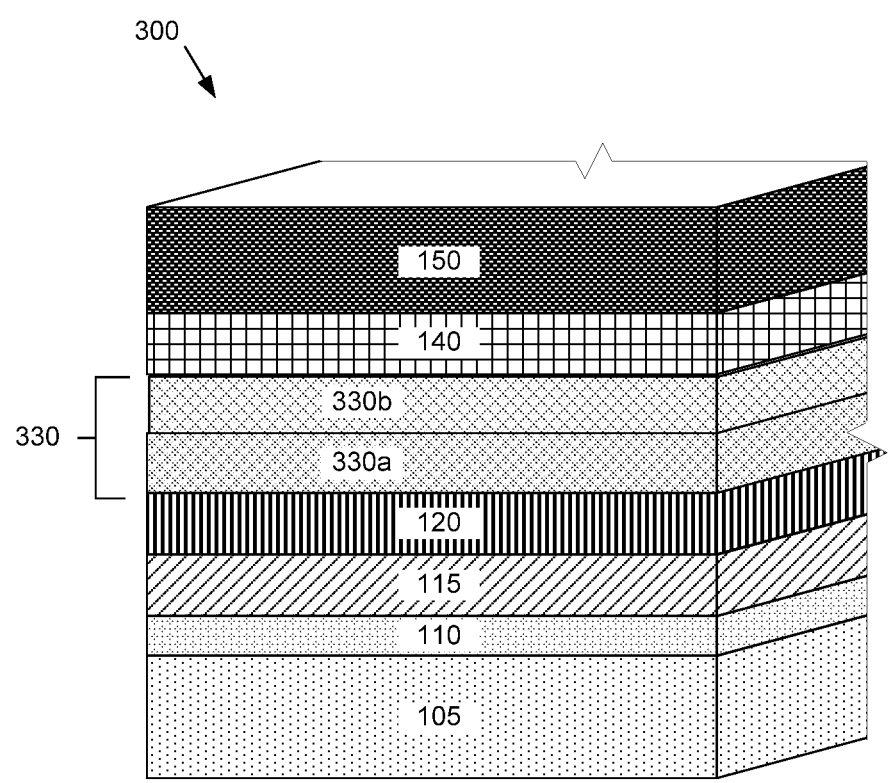
FIG. 3 depicts a schematic of functional layers in a third embodiment of a photovoltaic device.

Referring now to FIG. 3, a third embodiment of a photovoltaic device 300 is shown where like layers are designated as in the prior embodiments and described above. A photovoltaic device 300 according to the present embodiment includes a window layer 115 deposited over a substrate structure including a base layer 105 and a TCO layer 110. An absorber layer 120 is deposited over the window layer 115. The window layer 115 and the absorber layer 120 form a p-n junction in the photovoltaic device 300. An electron reflector layer 330 is deposited over the absorber layer 120. A back electrode layer 140 and a back contact layer 150 are formed over the electron reflector layer 330.

The electron reflector layer 330 according to the present embodiment is provided between the p-type absorber layer 120 and the back electrode layer 140. In this embodiment, the electron reflector layer 330 includes multiple sublayers 330a and 330b. The electron reflector sublayer 330a adjacent to the absorber layer 120 may be chosen to provide an effective conduction-band energy barrier while also maintaining a near-crystallographic compatibility with the absorber layer 120 material. The electron reflector sublayer 330b may be chosen to provide a low resistance electrical connection with both the electron reflector sublayer 330a and the adjacent back electrode layer 140 or back contact layer 150 material.

The sublayers 330a and 330b may be chosen from the group comprising: $ZnTe:Cu_2Te$ as described in the first embodiment above, $ZnTe/Cu_2Te$ alloy as described in the second embodiment above, $ZnTe$, $Cu_2Te$, $ZnTe$ doped with elemental copper between about 0.001 at % to about 2 at % (ZnTe:Cu), and cadmium zinc telluride (CZT) having a composition of $Cd_{(1-x)}Zn_xTe$ where x is between about 30% to about 70%. In one exemplary configuration according to the third embodiment, the electron reflector sublayer 330a may be ZnTe with an electron reflector sublayer 330b of $ZnTe/Cu_2Te$ alloy. In an alternative exemplary configuration, the electron reflector sublayer 330a may be CZT with an electron reflector sublayer 330b of $ZnTe:Cu_2Te$. Other configurations are also possible. The total electron reflector layer 330 may be between about 5 nm to about 50 nm thick.

The electron reflector layer 330 according to the third embodiment may be formed through a variety of known deposition processes including, for example, sputtering, physical vapor deposition, chemical vapor deposition, electro-chemical deposition, atomic layer deposition, thermal or electron-beam evaporation, and pulse laser deposition. One exemplary process for creating the electron reflector layer 330 would include similar steps as described above, first providing a substrate structure including a base layer, such as glass, with a TCO, window layer and absorber layer formed thereon within a deposition chamber. Then, sequentially evaporating a powder of material chosen for sublayer 330a within the deposition chamber and directing the vapor across the substrate structure using an inert carrier gas, such as a noble gas or nitrogen. That step is followed by a secondary deposition process with the material chosen for sublayer 330b. Within the deposition chamber the substrate structure is at a temperature below the condensation threshold of the material as the vapor is directed across the substrate structure to facilitate the formation of the layer. Alternatively sequential sputtering process as described above could be used to deposit the sublayers 330a and 330b together forming the electron reflector layer 330.

The window, absorber, and electron reflector layers described in the above embodiments are crystalline solids that can be sequentially formed in thin films on a substrate structure that may include a base layer, TCO, and additional buffer layers, barrier layers or coatings. In accordance with the above disclosed embodiments, an electron reflector layer may be included in a photovoltaic device between the absorber layer and the layer or layers forming a back current pathway.

Figure 4:
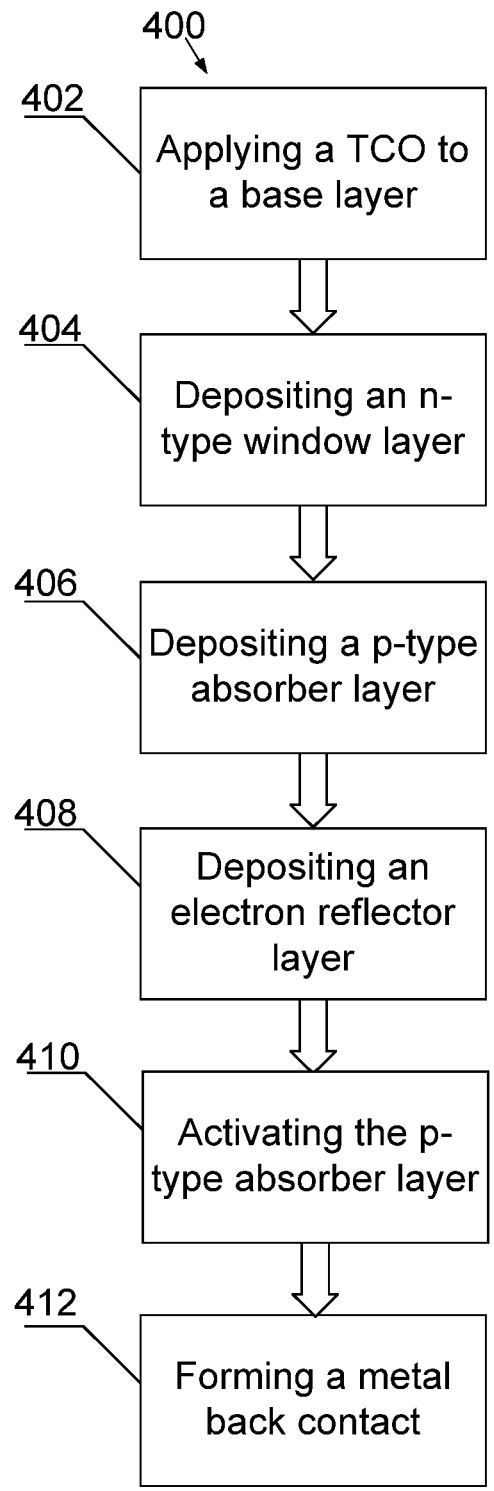
FIG. 4 depicts a process for manufacturing a photovoltaic device.

A method of manufacturing a photovoltaic structure, as depicted in FIG. 4, can include sequentially forming layers on a substrate. In a first step 402, a TCO layer can be formed on a base layer, such as glass. In a second step 404, a window layer can be deposited over the substrate structure including the previously applied TCO layer and base layer. The window layer may include an n-type CdS semiconductor. In a third step 406, an absorber layer can be deposited over the substrate structure including the window layer, TCO layer and base layer. The absorber layer may include a p-type CdTe semiconductor. In a fourth step 408, an electron reflector layer may be deposited. The electron reflector may include $ZnTe:Cu_2Te$, a $ZnTe/Cu_2Te$ alloy, or a bi-layer structure including two materials chosen from the group comprising: $ZnTe:Cu_2Te$, a $ZnTe/Cu_2Te$ alloy, $ZnTe$, $ZnTe:C$, $Cu_2Te$, and CZT. In a fifth step 410, an activation process as described below may be performed on the formed layers. In a sixth step 412, a back electrode layer and a back contact layer can be formed over the electron reflector layer.

Figure 5:
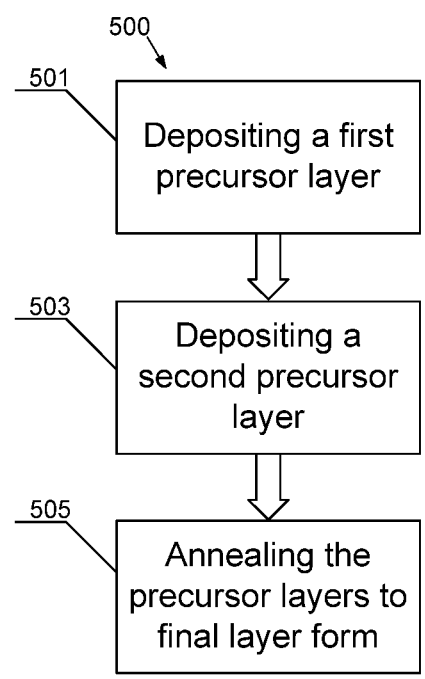
FIG. 5 depicts an expanded step of a process for manufacturing a layer in a photovoltaic device.

A step of the method of manufacturing a photovoltaic structure may include an expanded process as depicted in FIG. 5. The expanded process may be substituted for any step requiring the formation of an alloyed or doped material layer, regardless whether window layer, absorber layer or electron reflector layer. In a first step 501 of the expanded process, a first precursor layer, for example ZnTe, is deposited over a substrate structure. In a second step 503 of the expanded process, a second precursor layer, for example $Cu_2Te$, is deposited over the first precursor layer. In a third step 505 of the expanded process, the deposited precursor layers are annealed to form desired final layer form, for example a $ZnTe/Cu_2Te$ alloy layer.

As noted, in one embodiment of the expanded process, the first step includes depositing a ZnTe layer as the first precursor layer over a substrate structure. The second step includes depositing a $Cu_2Te$ layer as the second precursor layer over the ZnTe layer. The third step includes annealing the deposited precursor layers to form a $ZnTe/Cu_2Te$ layer of the desired $(Cu2)_xZn_{(1-x)}Te$ compositional ratio. In an alternative embodiment of the expanded process, the annealing of the precursor layers occurs during the subsequent deposition or formation of a back electrode or back contact layer.

Subsequent to formation of a layer, the structure may go through an activation process. When a CdTe, CST, or other absorber layer is used, an activation step can include the introduction of a material containing chlorine to the semiconductor bi-layer, for example cadmium chloride ($CdCl_2$), as a bathing solution, spray, or vapor, and an associated annealing of the absorber layer at an elevated temperature. For example, if $CdCl_2$ is used, the $CdCl_2$ can be applied over the absorber layer as an aqueous solution at a concentration of about 50-500 g/L. Alternatively, the absorber layer can be annealed with $CdCl_2$ by continuously flowing $CdCl_2$ vapor over the surface of the absorber layer during the annealing step. Alternative chlorine-doping materials can also be used such as $MnCl_2$, $MgCl_2$, NHCl2, $ZnCl_2$, or TeCl2. A typical anneal can be performed at a temperature of about 200°-450° C. for a total duration of 90 minutes or less, with a soaking time equal to or less than about 60 minutes.

Inclusion of an electron reflector layer can impact the activation process during which certain atoms may migrate from the layers as deposited to adjacent layers. For example, during the activation process the copper present in the electron reflector layer may diffuse into the absorber layer, such as CdTe as a dopant to the CdTe increasing the number of charge carriers (electrons) available to conduct as a photogenerated current. A photovoltaic device as described in the first embodiment above containing a ZnTe:$Cu_2$Te electron reflector layer 130 may have an activation process including a thermal treatment from about 250° C. to about 350° C., either with or without a chlorine-containing material present. A photovoltaic device as described in the second embodiment above containing a ZnTe/$Cu_2$Te alloy electron reflector layer 230 may have a thermal treatment from about 200° C. to about 300° C., either with or without a chlorine-containing material present. A photovoltaic device as described in the third embodiment above containing a bi-layer electron reflector layer 330 may have a thermal treatment from about 200° C. to about 350° C., either with or without a chlorine-containing material present.

For each of the embodiments describing various photovoltaic devices incorporating an electron reflector layer a multi-step activation processes or single activation steps may be used. With each desired activation mechanism such as semiconductor grain growth, chlorine diffusion, sulfur and selenium inter-diffusion into the layers, different thermal activation energy is required. Using a multi-step process allows each activation mechanism to be optimized by selecting the process temperature and duration.

As an example of a multi-step activation process, $CdCl_2$ can be applied in a single step followed by annealing using a multi-step temperature profile. For example, the anneal temperature may be ramped up to about 425° C. first, held there for a period of time (e.g. 1-10 minutes) and then ramped up further to 450°-460° C. and held there for an additional period of time (e.g., 1-10 minutes) before ramping the anneal temperature back down. This temperature profile for the above anneal results in different crystallinity characteristics of the CdTe material than those of a device activated in a single anneal step at 425° C. or alternatively at 450°-460° C. As an extension or alternative to this approach, multiple $CdCl_2$ applications, each paired with annealing at varied times and temperatures may also be used to achieve desired layer characteristics.

From the foregoing description, one ordinarily skilled in the art can easily ascertain the essential characteristics of the embodiments and, without departing from the spirit and scope thereof, can make various changes and modifications to adapt the disclosed embodiments to various usages and conditions.

What is claimed:

1. A photovoltaic device comprising:
   a p-type absorber layer;
   an electron reflector layer over the p-type absorber layer, wherein the electron reflector layer consists of a first sublayer and a second sublayer, and wherein:
      the first sublayer is adjacent the absorber layer and comprises cadmium zinc telluride, and
      the second sublayer comprises zinc telluride doped with elemental copper; and
   a back electrode over the electron reflector layer, wherein the back electrode layer comprises electrically conductive material.

2. A process for manufacturing the photovoltaic device of claim 1, comprising the steps of:
   forming the electron reflector layer over the p-type absorber layer; and
   activating the photovoltaic device by applying a thermal treatment.

3. The process of claim 2, wherein the step of forming an electron reflector layer is performed by sequentially forming the first sublayer and the second sublayer.

4. The photovoltaic device of claim 1, wherein the p-type absorber layer comprises cadmium and tellurium.

5. The photovoltaic device of claim 4, wherein the p-type absorber is doped with copper.

6. The photovoltaic device of claim 1, comprising a buffer layer over a transparent conductive oxide layer, wherein the absorber layer is between the buffer layer and the back contact layer.

7. The photovoltaic device of claim 6, wherein the transparent conductive oxide layer comprises tin oxide, zinc oxide, indium gallium oxide, cadmium stannate, cadmium tin oxide, cadmium indium oxide, fluorine doped tin oxide, aluminum doped zinc oxide, or indium tin oxide, doped variations thereof, or combinations thereof.

8. The photovoltaic device of claim 6, wherein the buffer layer comprises tin oxide, zinc tin oxide, zinc oxide, zinc oxysulfide, or zinc magnesium oxide.

9. The photovoltaic device of claim 6, comprising a barrier layer, wherein the transparent conductive oxide layer is over the barrier layer.

10. The photovoltaic device of claim 1, wherein the back electrode layer comprises molybdenum nitride, chromium nitride, silver, nickel, copper, aluminum, titanium, palladium, chrome, molybdenum, gold, or combinations thereof.

11. The photovoltaic device of claim 1, wherein the cadmium zinc telluride has a composition of $Cd_{(1-x)}Zn_xTe$ wherein x is between about 0.30 to about 0.70.

12. The photovoltaic device of claim 9, wherein the barrier layer comprises silicon nitride, silicon oxide, aluminum-doped silicon oxide, boron-doped silicon nitride, phosphorus-doped silicon nitride, silicon oxide-nitride, combinations thereof, or alloys thereof.

* * * * *